United States Patent
Zhao (10) Patent No.: US 10,944,370 B2
(45) Date of Patent: Mar. 9, 2021

(54) MULTI-GAIN MODE POWER AMPLIFIER, CHIP, AND COMMUNICATION TERMINAL

(71) Applicant: VANCHIP (TIANJIN) TECHNOLOGY CO., LTD., Tianjin (CN)

(72) Inventor: Jinxin Zhao, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 49 days.

(21) Appl. No.: 16/314,217

(22) PCT Filed: Jun. 30, 2017

(86) PCT No.: PCT/CN2017/091341
§ 371 (c)(1),
(2) Date: Dec. 28, 2018

(87) PCT Pub. No.: WO2018/001380
PCT Pub. Date: Jan. 4, 2018

(65) Prior Publication Data
US 2019/0207577 A1      Jul. 4, 2019

(30) Foreign Application Priority Data

Jun. 30, 2016 (CN) .......................... 201610507258.X (51) Int. Cl.
*H03F 3/217* (2006.01)
*H03G 3/30* (2006.01)
(Continued)

(52) U.S. Cl.
CPC ............. *H03G 3/3036* (2013.01); *H03F 1/56* (2013.01); *H03F 3/195* (2013.01); *H03F 3/21* (2013.01); *H03F 3/245* (2013.01); *H03G 3/3042* (2013.01)

(58) Field of Classification Search
CPC ............. H03F 3/2176; H03F 1/22; H03F 1/30
(Continued)

(56) References Cited

U.S. PATENT DOCUMENTS 4,559,503 A * 12/1985 Camand ................. H04B 3/148
                                                      330/302
6,771,130 B2 * 8/2004 Hasegawa ............... H03F 1/302
                                                      330/302
(Continued)

FOREIGN PATENT DOCUMENTS

CN          1274991 A     11/2000
CN       102969995 A      3/2013
(Continued)

OTHER PUBLICATIONS

International Search Report from PCT/CN2017/091341, dated Oct. 10, 2017, with English translation provided by WIPO.
(Continued)

*Primary Examiner* — Henry Choe
(74) *Attorney, Agent, or Firm* — Ladas & Parry, LLP (57) ABSTRACT

A multi-gain mode power amplifier, a chip, and a communication terminal. The multi-gain mode power amplifier comprises at least one amplifier circuit. The amplifier circuit comprises a bias circuit, a feedback circuit, a transistor (101), and an input matching network/output matching network. A bias voltage or a control voltage (120) is adjusted to make the feedback circuit to be either turned on or turned off, thus allowing the amplifier circuit to work in a high-gain mode or a low-gain mode. The multi-gain mode power amplifier has different gain modes, fully satisfies the actual demand of the communication terminal to work in the high-gain mode when transmitting a high power and to work in the low-gain mode when transmitting a low power.

16 Claims, 6 Drawing Sheets

(51) Int. Cl.
*H03F 1/56* (2006.01)
*H03F 3/24* (2006.01)
*H03F 3/195* (2006.01)
*H03F 3/21* (2006.01)

(58) Field of Classification Search
USPC .............................. 330/310, 302, 296, 285
See application file for complete search history.

(56) References Cited

U.S. PATENT DOCUMENTS

| | | | | |
|---|---|---|---|---|
| 7,202,736 | B1 * | 4/2007 | Dow | H03F 1/14 |
| | | | | 330/129 |
| 7,315,205 | B2 * | 1/2008 | Kim | H03F 1/0211 |
| | | | | 330/124 D |
| 7,482,878 | B2 * | 1/2009 | Nakai | H03F 1/52 |
| | | | | 330/298 |
| 7,688,133 | B2 * | 3/2010 | Yamamoto | H03F 1/0261 |
| | | | | 330/51 |
| 2005/0270104 | A1 | 12/2005 | Yamamoto | |
| 2015/0028952 | A1 | 1/2015 | Alzaher | |

FOREIGN PATENT DOCUMENTS

| | | |
|---|---|---|
| CN | 203261299 U | 10/2013 |
| CN | 104753477 A | 7/2015 |
| CN | 104917475 A | 9/2015 |
| CN | 106169915 A | 11/2016 |

OTHER PUBLICATIONS

Written Opinion of the International Searching Authority from PCT/CN2017/091341, dated Oct. 10, 2017, with English translation provided by WIPO.
International Preliminary Report on Patentability from PCT/CN2017/091341, dated Jan. 1, 2019, with English translation provided by WIPO.
First Office Action from CN app. No. 201610607258.X, dated Aug. 27, 2019, with English translation provided by Global Dossier.

* cited by examiner

MULTI-GAIN MODE POWER AMPLIFIER, CHIP, AND COMMUNICATION TERMINAL

CROSS-REFERENCE TO RELATED APPLICATIONS

The present application is the U.S. national phase of PCT/CN2017/091341 filed on Jun. 30, 2017, which claims the priority to the Chinese Patent Application No. 201610507258.X filed on Jun. 30, 2016, the disclosures of which are incorporated herein by reference in their entireties.

BACKGROUND

Technical Field

The present invention relates to a radio frequency power amplifier, and in particular, to a multi-gain mode power amplifier, a chip including same and a communication terminal including same, and belongs to the field of integrated circuit technologies.

Related Art

With the development of wireless communications technologies, and in particular, with the massive popularization of 3G/4G communication standards, there are higher requirements of communications systems. Signals received by base stations from communication terminals such as mobile phones are easily affected by objective conditions such as distance, landform, and weather. To meet requirements on performance indexes such as signal stability and linearity of a base station, a radio frequency power amplifier usually adopts multi-power modes typically including a high-gain mode and a low-gain mode. The low-gain mode requires to ensure performance such as linearity while reduce gains at a relatively low output power level, thereby improving the efficiency.

In practice, a communication terminal needs to adjust a transmitted power based on a path attenuation degree, and transmits a high power when the path attenuation is high, consuming a relatively large amount of current, or transmits a low power when the path attenuation is low, consuming a relatively small amount of current. This requires a power amplifier to not only have different gain modes, which enables the communication terminal to work in the high-gain mode when a high power is transmitted and work in the low-gain mode when a low power is transmitted, but also reduce a working current in the low-gain mode, to save battery power.

SUMMARY

A primary technical problem to be resolved in the present invention is to provide a multi-gain mode power amplifier.

Another technical problem to be resolved in the present invention is to provide a chip and a communication terminal that include the multi-gain mode power amplifier.

To achieve the foregoing objectives, the following technical solutions are used in the present invention:

According to a first aspect of embodiments of the present invention, a multi-gain mode power amplifier is provided. The multi-gain mode power amplifier includes at least one stage of amplifier circuit, where the amplifier circuit includes a bias circuit, a feedback circuit, a transistor, and an input matching network/output matching network, where the bias circuit, the feedback circuit, the transistor, and the input matching network are connected to each other;

the input matching network/the output matching network is configured to receive/send a radio frequency signal; a bias voltage end is connected to the bias circuit and the feedback circuit, a control voltage end is connected to the feedback circuit, and a power supply supplies power to the amplifier circuit by using an inductor; and a bias voltage or a control voltage is adjusted to enable the feedback circuit to be in a turned-on or turned-off state, so that the amplifier circuit works in a high-gain mode or a low-gain mode.

Preferably, there are two stages of amplifier circuits, a first-stage amplifier circuit is a variable gain structure, a second-stage amplifier circuit is a fixed gain structure, and the first-stage amplifier circuit and the second-stage amplifier circuit are connected in series.

Preferably, there is a plurality of stages of amplifier circuits, and the plurality of stages includes several variable gain structures and several fixed gain structures connected in cascade.

Preferably, the output matching network is configured to implement impedance translation of the radio frequency signal, to output a power to the outside based on a radio frequency signal transmitted by the first-stage amplifier circuit.

Preferably, when the multi-gain mode power amplifier is in the high-gain mode, a first bias voltage of the first-stage amplifier circuit is greater than a breakover voltage of a transistor of the first-stage amplifier circuit, and a second bias voltage of the second-stage amplifier circuit is greater than a breakover voltage of a transistor of the second-stage amplifier circuit.

Preferably, when the multi-gain mode power amplifier is in the high-gain mode, the control voltage of the feedback circuit of the first-stage amplifier circuit is less than a supply voltage of the first-stage amplifier circuit, and a voltage difference between the control voltage and the supply voltage is less than a breakover voltage of the transistor, so that the feedback circuit is in a turned-off state, and the first-stage amplifier circuit implements the high-gain mode by using the transistor.

Preferably, when the multi-gain mode power amplifier is in the low-gain mode, the control voltage of the feedback circuit is less than a supply voltage of the first-stage amplifier circuit, and a voltage difference between the control voltage and the supply voltage is greater than a breakover voltage of a transistor of the first-stage amplifier circuit, so that the feedback circuit is in a turned-on state, and the first-stage amplifier circuit implements the low-gain mode.

Preferably, when the multi-gain mode power amplifier is in a mode 1, a supply voltage (VCC) of the first-stage amplifier circuit is greater than a sum of a turn-on voltage (Vth_main) of the transistor of the first-stage amplifier circuit and a breakover voltage (Vth_diode) of a diode.

Preferably, when a bias voltage (Vreg) of a first bias circuit is not less than a voltage difference between the supply voltage (VCC) and the breakover voltage (Vth_diode) of the diode and is not greater than a maximum value (Vreg_max) of the bias voltage, the transistor in the first-stage amplifier circuit is turned on, and the diode is not conducted, to enable the first-stage amplifier circuit to implement the high-gain mode.

Preferably, a current of the transistor decreases as the bias voltage (Vreg) of the bias circuit decreases.

Preferably, when the bias voltage (Vreg) of the bias circuit is not less than the turn-on voltage (Vth_main) of the transistor and is less than the voltage difference between the supply voltage (VCC) and the breakover voltage (Vth_diode) of the diode, the transistor is turned on, and the diode is also conducted, so that a gain of the first-stage amplifier circuit decreases.

Preferably, when the bias voltage (Vreg) of the bias circuit is not less than 0 and is less than the turn-on voltage (Vth_main) of the transistor, the transistor is not turned on, the diode is conducted, an input signal is transmitted to the second-stage amplifier circuit by using the feedback circuit, and a gain of the first-stage amplifier circuit is the lowest.

Preferably, when the multi-gain mode power amplifier is in a mode 2, a supply voltage (VCC) of the first-stage amplifier circuit is not greater than a sum of a turn-on voltage (Vth_main) of the transistor of the first-stage amplifier circuit and a breakover voltage (Vth_diode) of a diode.

Preferably, when the bias voltage (Vreg) of the bias circuit is not less than the turn-on voltage (Vth_main) of the transistor and is not greater than a maximum value (Vreg_max) of the bias voltage, the transistor is turned on, the diode is not conducted, and the gain mode of the first-stage amplifier circuit is implemented by using the transistor.

Preferably, when the bias voltage (Vreg) of the bias circuit is not less than a voltage difference between the supply voltage (VCC) and the breakover voltage (Vth_diode) of the diode and is less than the turn-on voltage (Vth_main) of the transistor, the transistor is not turned on, the diode is also not conducted, and the first-stage amplifier circuit is in a turned-off state.

Preferably, when the bias voltage (Vreg) of the bias circuit is not less than 0 and is less than a voltage difference between the supply voltage (VCC) and the breakover voltage (Vth_diode) of the diode, the transistor is not turned on, the diode is conducted, and an input signal is transmitted to the second-stage amplifier circuit by using the feedback circuit.

According to a second aspect of the embodiments of the present invention, a chip having a multi-gain mode power amplifier is provided. The chip includes the multi-gain mode power amplifier described in the first aspect.

According to a third aspect of the embodiments of the present invention, a communication terminal having a multi-gain mode power amplifier is provided. The communication terminal includes the multi-gain mode power amplifier described in the first aspect.

Compared with the prior art, according to the multi-gain mode power amplifier provided in the present invention, the adjustment of the bias voltage or the control voltage enables the multi-gain mode power amplifier to have different gain modes. This fully meets an actual requirement that the communication terminal works in the high-gain mode when transmitting a high power and works in the low-gain mode when transmitting a low power. Especially, in the low-gain mode, the multi-gain mode power amplifier provided in the present invention can effectively reduce a working current, thereby further saving power.

DETAILED DESCRIPTION

The following further describes in detail the technical content of the present invention with reference to the accompanying drawings and specific embodiments.

First, it should be noted that, in each embodiment of the present invention, a related communication terminal refers to a computer device including a mobile phone, a notebook computer, a tablet computer, an in-vehicle computer, and the like that can be used in a mobile environment and that supports various communication standards such as GSM, EDGE, TD_SCDMA, TDD_LTE, and FDD_LTE. In addition, the multi-gain mode power amplifier is also applicable to another scenario in which a multimode technology is used, for example, a communications base station compatible with various communication standards.

In the prior art, both the three-mode solution and the five-mode solution provided by China Mobile Communications Corporation include the following three modes: GSM/TD_SCDMA/TDD_LTE. In addition, due to limitations of LTE network coverage, the current three-mode solution and the five-mode solution still need to be compatible with an EDGE mode. A frequency on a PCS band in a high-frequency GSM is 1850 MHz to 1910 MHz, a frequency on a TD_SCDMA frequency band is 1880 MHz to 1920 MHz and 2010 MHz to 2025 MHz, and a frequency on a TDD_LTE B39 frequency band is 1880 MHz to 1920 MHz. It can be learned that frequencies in the three modes are relatively close. In addition, the frequency bands of the GSM and the EDGE are completely overlapped, making circuit multiplexing necessarily possible. The multi-gain mode power amplifier works in different modes, and therefore has different requirements on an output power, a gain, and a working current. The foregoing indexes of the multi-gain mode power amplifier are determined based on a control voltage or a bias voltage, so that optimization of the control voltage or the bias voltage of the multi-gain mode power amplifier in different modes can implement overall optimization of the output power, the gain, and the current.

Figure 1:
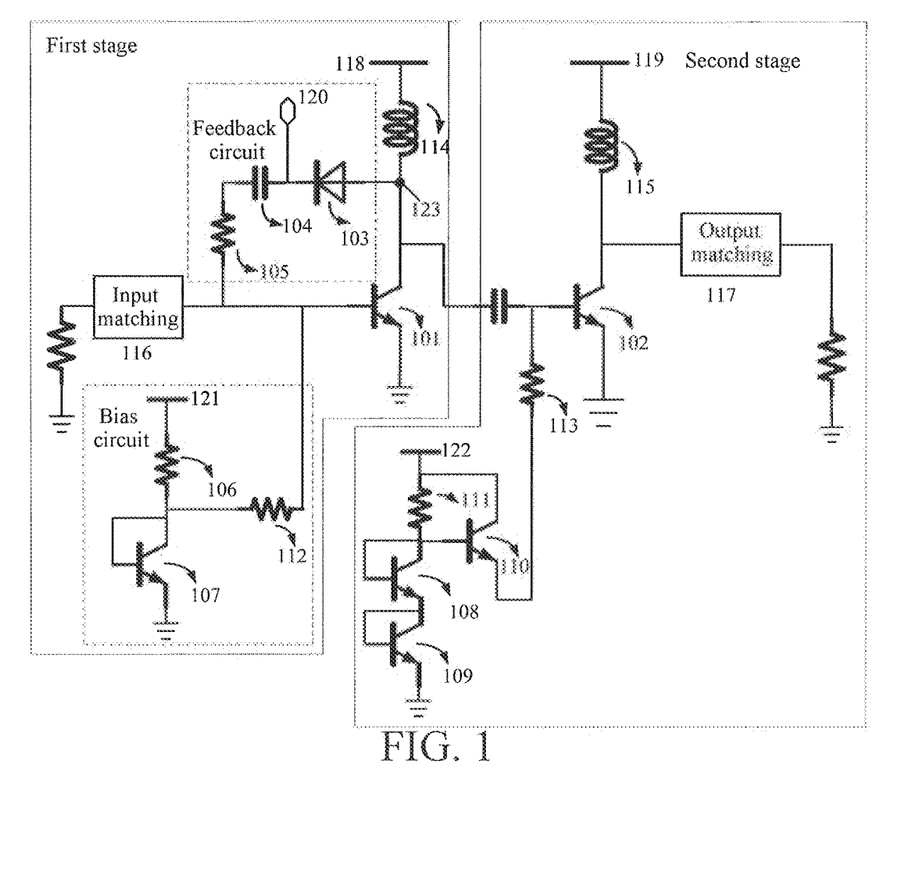
FIG. 1 is a principle diagram of a circuit of a multi-gain mode power amplifier.

FIG. 1 is a principle diagram of a circuit of a multi-gain mode power amplifier. As shown in FIG. 1, the multi-gain mode power amplifier includes a first-stage amplifier circuit and a second-stage amplifier circuit connected in series.

As shown in FIG. 1, the first-stage amplifier circuit includes a first bias circuit, a first feedback circuit, a transistor 101, and an input matching network 116. The first bias circuit includes a transistor 107, a resistor 106 and a resistor 112. A first bias voltage 121 is connected to a collector of the transistor 107 by using the resistor 106. Emitters of the transistor 107 and the transistor 101 are grounded. A base of the transistor 107 is not only connected between the resistor 106 and the base of the transistor 107, but also connected to an end of an input matching network, a base of the transistor 101, and a resistor 105 by using the resistor 112. The first feedback circuit includes a diode 103, a capacitor 104, and the resistor 105 sequentially connected in series. A control voltage 120 is disposed between a cathode of the diode 103 and the capacitor 104, and the control voltage 120 is configured to control conduction and non-conduction of the diode 103. An anode of the diode 103 is connected to an inductor 114 and a collector of the transistor 101 by using a node 123. A resistor is disposed between another end of the input matching network 116 and the ground, and is configured to access a radio frequency signal and implement impedance matching. A supply voltage 118 supplies a voltage to the first-stage amplifier circuit by using the inductor 114.

The second-stage amplifier circuit includes a second bias circuit, a transistor 102, and an output matching network 117. The second bias circuit includes a transistor 108, a transistor 109, a transistor 110, a resistor 111, and a resistor 113. A second bias voltage 122 is connected to the resistor 111 and a collector of the transistor 110. The resistor 111 is further connected to a collector of the transistor 108. A base of the transistor 108 is not only connected between the collector of the transistor 108 and the resistor 111, but also connected to a base of the transistor 110. An emitter of the transistor 108, a collector of the transistor 109, and a base of the transistor 109 are connected to each other. An emitter of the transistor 109 is grounded. An emitter of the transistor 110 is connected to a base of the transistor 102 and a capacitor by using the resistor 113. An emitter of the transistor 102 is also grounded. The transistor 102 is connected to an inductor 115 and an end of the output matching network 117. A resistor is also disposed between another end of the output matching network 117 and the ground, to implement impedance translation of radio frequency signal, to output a radio frequency output power based on a radio frequency signal transmitted by the first-stage amplifier circuit. A supply voltage 119 supplies a voltage to the first-stage amplifier circuit by using the inductor 115.

The capacitor (which is a capacitor connected to the base of the transistor 102) in the second-stage amplifier circuit is coupled between the node 123 and the transistor 101 in the first-stage amplifier circuit, to form the multi-gain mode power amplifier. Turning-on or turning-off of the first feedback circuit is controlled by adjusting the control voltage, to implement different gain modes of the power amplifier. When the multi-gain mode power amplifier is in a high-gain mode, a voltage value of the first bias voltage 121 is greater than a voltage value of a breakover voltage of the transistor 101, so that the transistor 101 has a specific quiescent current. A voltage value of the second bias voltage 122 is greater than a voltage value of a breakover voltage of the transistor 102, so that the transistor 102 also has a specific quiescent current. A voltage value of the control voltage 120 of the first feedback circuit of the first-stage amplifier circuit is less than a voltage value of the supply voltage 118 of the first-stage amplifier circuit. In addition, a voltage difference between the control voltage 120 and the supply voltage 118 is less than the voltage value of the breakover voltage of the transistor 101. In this case, voltage values at the two ends of the diode 103 are less than a voltage value of a breakover voltage of the diode 103, so that the diode 103 is in a non-conducted state, and therefore the first feedback circuit is in a turned-off state (which means that the feedback circuit barely works), and an amplification effect is implemented by using the transistor 101, so that the first-stage amplifier circuit implements the high-gain mode. When the multi-gain mode power amplifier is in a low-gain mode, the voltage value of the control voltage 120 of the feedback circuit is less than the voltage value of the supply voltage 118 of the first-stage amplifier circuit. In addition, the voltage difference between the control voltage 120 and the supply voltage 118 is greater than the breakover voltage of the transistor 101. In this case, the voltage values at the two ends of the diode 103 are greater than the voltage value of the breakover voltage of the diode 103, so that the diode 103 is in a conducted state, and the first feedback circuit is in a turned-on state (where the feedback circuit starts to work), and the first-stage amplifier circuit implements the low-gain mode. The multi-gain mode power amplifier has a same quiescent current in the high-gain mode and the low-gain mode, and therefore cannot save currents in the low-gain mode.

According to the multi-gain mode power amplifier provided in the present invention, without changing the structure of the second-stage amplifier circuit, by connecting the first-stage amplifier circuit and the second-stage amplifier circuit that have different structures in series, the multi-gain mode power amplifier not only can implement the high-gain mode or the low-gain mode, but also can save currents in the low-gain mode. Further descriptions are given below by using specific embodiments.

First Embodiment

Figure 2:
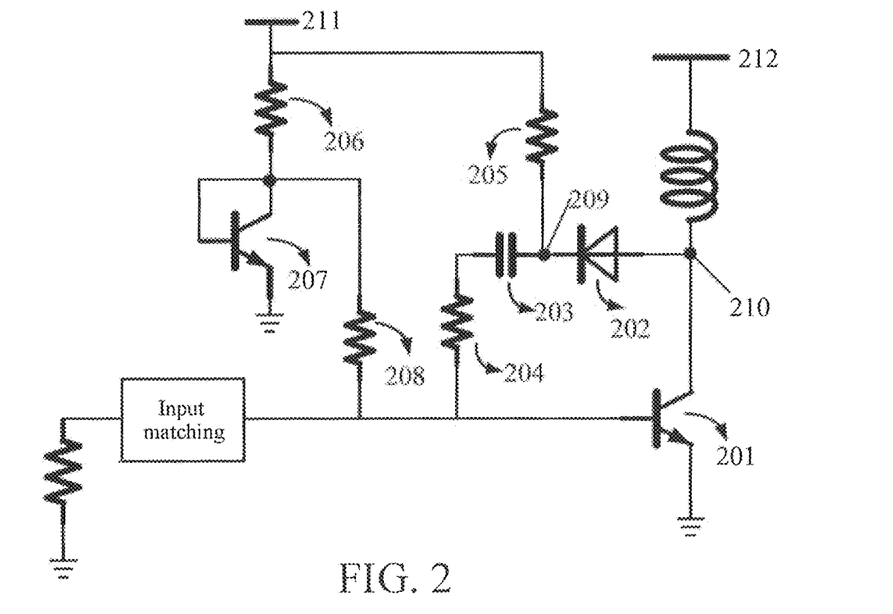
FIG. 2 is a principle diagram of a first-stage amplifier circuit according to a first embodiment of the present invention.

As shown in FIG. 2, a first-stage amplifier circuit provided in the first embodiment includes a first bias circuit, a first feedback circuit, a transistor 201, and an input matching network. The first bias circuit includes a transistor 207, a resistor 206, and a resistor 208. An emitter of the transistor 207 is grounded. A base of the transistor 207 is connected to the resistor 206, a collector of the transistor 207, and the resistor 208. The first feedback circuit includes a diode 202, a capacitor 203, and a resistor 204 sequentially connected in series. A resistor 205 is disposed between a node 209 and a first bias voltage 211. A resistor is disposed between an end of the input matching network and the ground (which implements the functions described above). Another end of the input matching network is connected to the resistor 208, the resistor 204, and a base of the transistor 201. An emitter of the transistor 201 is grounded. The first bias voltage 211 provides a bias voltage to the first bias circuit by using the resistor 206. A supply voltage 212 is connected to the diode 202 and the transistor 201 by using an inductor. Likewise, a capacitor of a second-stage amplifier circuit is connected between a node 210 and a collector of the transistor 201, to form a multi-gain mode power amplifier. Turning-on and turning-off of the first feedback circuit is controlled by adjusting a voltage value of the first bias voltage 211, so that the multi-gain mode power amplifier works in a high-gain mode or a low-gain mode, and a working current of the multi-gain mode power amplifier in the low-gain mode is reduced.

A working principle of the multi-gain mode power amplifier is as follows. As shown in Table 1, the multi-gain mode power amplifier is in a mode 1 (the high-gain mode) and meets the following conditions. When the supply voltage 212 (VCC) of the first-stage amplifier circuit is greater than a sum of a turn-on voltage (Vth_main) of the transistor 201 and a breakover voltage (Vth_diode) of the diode 202, and when the first bias voltage 211 (Vreg) of the first bias circuit is not less than a voltage difference between the supply voltage 212 (VCC) and the breakover voltage (Vth_diode) of the diode 202 and is not greater than a maximum value (Vreg_max) of the first bias voltage 211, the transistor 201 in the first-stage amplifier circuit is turned on, the diode 202 in the first feedback circuit is not conducted, the first feedback circuit does not work, and the first-stage amplifier circuit achieves amplification by using the transistor 201, so that the first-stage amplifier circuit implements the high-gain mode. When the first bias voltage 211 (Vreg) of the first bias circuit is not less than the turn-on voltage (Vth_main) of the transistor 201 and is less than the voltage difference between the supply voltage 212 (VCC) and the breakover voltage (Vth_diode) of the diode 202, the transistor 201 is turned on, and the diode 202 is also conducted, and the first feedback circuit starts to work, to reduce a gain of the first-stage amplifier circuit. When the first bias voltage 211 (Vreg) of the first bias circuit is not less than 0 and is less than the turn-on voltage (Vth_main) of the transistor 201, the transistor 201 is not turned on, the diode 202 is conducted, and the first feedback circuit works. In this case, an input signal is transmitted to the second-stage amplifier circuit by using the first feedback circuit, and the gain of the first-stage amplifier circuit is the lowest.

When the multi-gain mode power amplifier is in a mode 2 (the low-gain mode), the following conditions are met. When the supply voltage 212 (VCC) of the first-stage amplifier circuit is not greater than the sum of the turn-on voltage (Vth_main) of the transistor 201 and the breakover voltage (Vth_diode) of the diode 202, and when the first bias voltage 211 (Vreg) of the first bias circuit is not less than the turn-on voltage (Vth_main) of the transistor 201 and is not greater than the maximum value (Vreg_max) of the first bias voltage 211, the transistor 201 is turned on, the diode 202 is not conducted, and the gain mode of the first-stage amplifier circuit is implemented by using the transistor 201. When the first bias voltage 211 (Vreg) of the first bias circuit is not less than the voltage difference between the supply voltage 212 (VCC) and the breakover voltage (Vth_diode) of the diode 202 and is less than the turn-on voltage (Vth_main) of the transistor 201, the transistor 201 is not turned on, and the diode 202 is also not conducted. In this case, the first-stage amplifier circuit is in a completed turned-off state. When the first bias voltage 211 (Vreg) of the first bias circuit is not less than 0 and is less than the voltage difference between the supply voltage 212 (VCC) and the breakover voltage (Vth_diode) of the diode 202, the transistor 201 is not turned on, the diode 202 is conducted, and the first feedback circuit works. In this case, the input signal is transmitted to the second-stage amplifier circuit by using the first feedback circuit.

Figure 6:
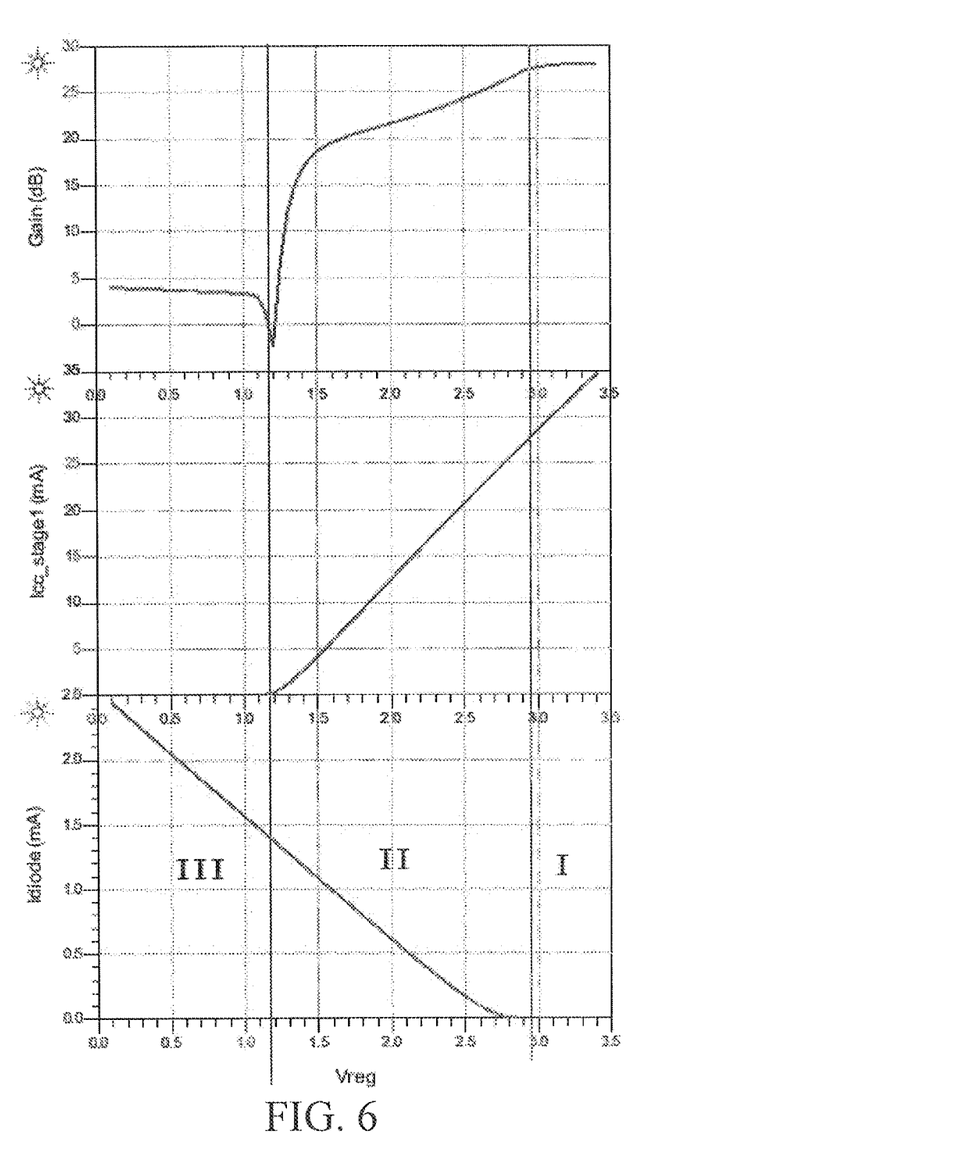
FIG. 6 and FIG. 7 are respectively simulation diagrams of a gain on the first-stage amplifier circuit, a current of a transistor 201, and a current of a diode 202 according to the first embodiment of the present invention.

FIG. 6 is a simulation diagram of the first bias voltage 211 (Vreg) and the gain mode of the first-stage amplifier circuit, the current of the transistor 201 and the current of the diode 202 when the supply voltage 212 (VCC) of the first-stage amplifier circuit is greater than the sum of the turn-on voltage (Vth_main) of the transistor 201 and the breakover voltage (Vth_diode) of the diode 202. In the figure, an area I corresponds to a case in Table 1 in the mode 1 (the high-gain mode) in which the first bias voltage 211 (Vreg) of the first bias circuit is not less than the voltage difference between the supply voltage 212 (VCC) and the breakover voltage (Vth_diode) of the diode 202 and is not greater than the maximum value (Vreg_max) of the first bias voltage 211. In this case, the current of the diode 202 is 0, and the gain of the first-stage amplifier circuit is implemented by using the transistor 201. The current of the transistor 201 decreases as the first bias voltage 211 (Vreg) of the first bias circuit decreases, and the gain mode of the first-stage amplifier circuit keeps unchanged. An area II corresponds to a case in Table 1 in the mode 1 (the high-gain mode) in which the first bias voltage 211 (Vreg) of the first bias circuit is not less than the turn-on voltage (Vth_main) of the transistor 201 and is less than the voltage difference between the supply voltage 212 (VCC) and the breakover voltage (Vth_diode) of the diode 202. In this case, the transistor 201 is turned on, and the diode 202 is also conducted, the gain mode of the first-stage amplifier circuit is implemented by using the transistor 201 and the first feedback circuit. As the first bias voltage 211 (Vreg) decreases, the current of the diode 202 in the first feedback circuit increases, the current of the transistor 201 decreases, a total amount of currents consumed by first-stage amplifier circuit is reduced, and the gain of the first-stage amplifier circuit is reduced. An area III corresponds to a case in Table 1 in the mode 1 (the high-gain mode) in which the first bias voltage 211 (Vreg) of the first bias circuit is not less than 0 and is less than the turn-on voltage (Vth_main) of the transistor 201. In this case, the current of the transistor 201 is 0, and the gain mode of the first-stage amplifier circuit is implemented by using the first feedback circuit to be the low-gain mode. In this case, the total amount of currents consumed by the first-stage amplifier circuit is a conduction current of the diode 202 that is far less than the total amount of currents of the first-stage amplifier circuit in the high-gain mode, and therefore power consumption can be effectively reduced.

Figure 7:
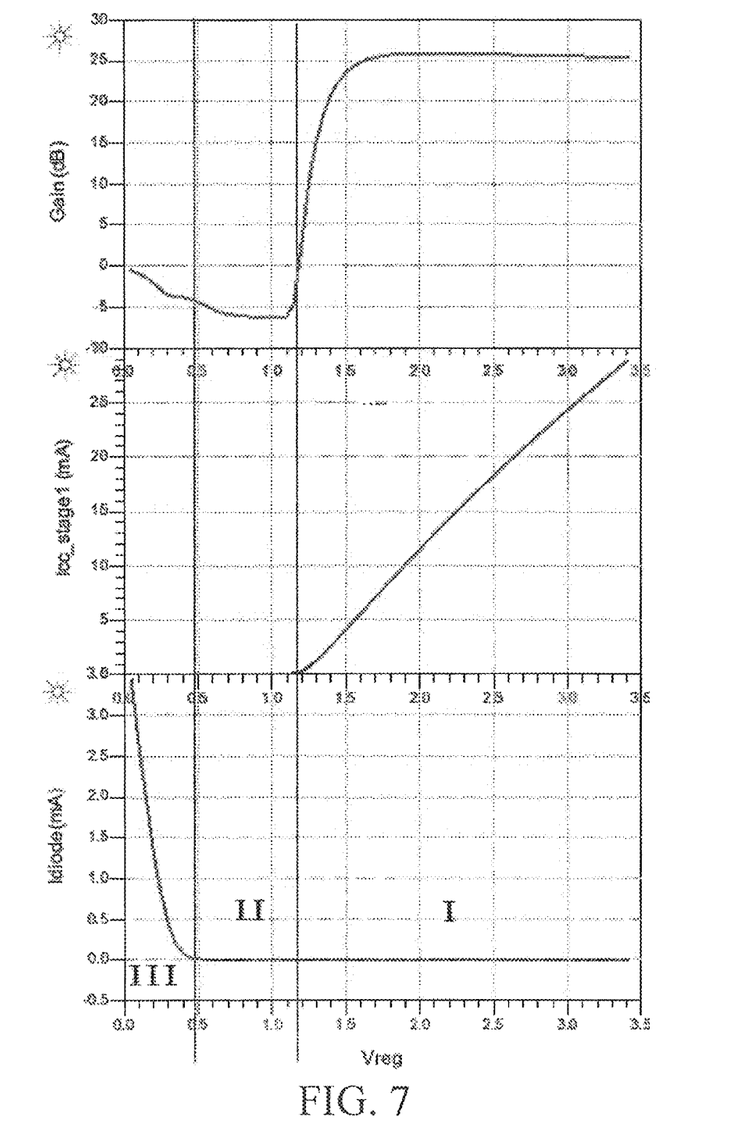

FIG. 7 is a simulation diagram of the first bias voltage 211 (Vreg) and the gain mode of the first-stage amplifier circuit, the current of the transistor 201 and the current of the diode 202 when the supply voltage 212 (VCC) of the first-stage amplifier circuit is less than the sum of the turn-on voltage (Vth_main) of the transistor 201 and the turn-on voltage (Vth_diode) of the diode 202. An area I corresponds to a case in Table 1 in the mode 2 (the low-gain mode) in which the first bias voltage 211 (Vreg) of the first bias circuit is not less than the turn-on voltage (Vth_main) of the transistor 201 and is not greater than the maximum value (Vreg_max) of the first bias voltage 211. The first bias voltage 211 (Vreg) of the first bias circuit is greater than the turn-on voltage (Vth_main) of the transistor 201, the current of the diode 202 is 0, and the gain mode of the first-stage amplifier circuit is implemented by using the transistor 201. An area II corresponds to a case in Table 1 in the mode 2 (the low-gain mode) in which the first bias voltage 211 (Vreg) of the first bias circuit is not less than the voltage difference between the supply voltage 212 (VCC) and the breakover voltage (Vth_diode) of the diode 202 and is less than the turn-on voltage (Vth_main) of the transistor 201. In this case, the current of the transistor 201 is 0, the current of the diode 202 is 0, and the first-stage amplifier circuit is in a turned-off state. An area III corresponds to a case in Table 1 in the mode 2 (the low-gain mode) in which the first bias voltage 211 (Vreg) of the first bias circuit is not less than 0 and is less than the voltage difference between the supply voltage 212 (VCC) and the breakover voltage (Vth_diode) of the diode 202. In this case, the current of the transistor 201 is 0, the current of the diode 202 is not 0, and the first feedback circuit works. In this case, the input signal is transmitted to the second-stage amplifier circuit by using the first feedback circuit of the first-stage amplifier circuit, to implement the low-gain mode.

TABLE 1

Table of a relationship between a working state of the first-stage amplifier circuit and the first bias voltage

| Mode 1: VCC > Vth_main + Vth_diode | |
|---|---|
| Vreg_max ≥ Vreg ≥ VCC_Vth_diode | The transistor is turned on, and the diode is not conducted |
| VCC-Vth_diode > Vreg ≥ Vth_main | The transistor is turned on, and the diode is conducted |
| Vth_main > Vreg ≥ 0 | The transistor is not turned on, and the diode is conducted |
| Mode 2: VCC ≤ Vth_main + Vth_diode | |
| Vreg_max ≥ Vrea ≥ Vth_main | The transistor is turned on, and the diode is not conducted |
| Vth_main > Vreg ≥ VCC-Vth_diode | The transistor is not turned on, and the diode is not conducted |
| VCC-Vth_diode > Vreg ≥ 0 | The transistor is not turned on, and the diode is conducted |

Second Embodiment

In a same process, the turn-on voltage (Vth_diode) of the diode and the turn-on voltage (Vth_main) of the transistor in the first-stage amplifier circuit are the same. For ease of description, the turn-on voltage (Vth_diode) of the diode and the turn-on voltage (Vth_main) of the transistor are collectively referred to as Vth in the second embodiment to a fourth embodiment.

Figure 3:
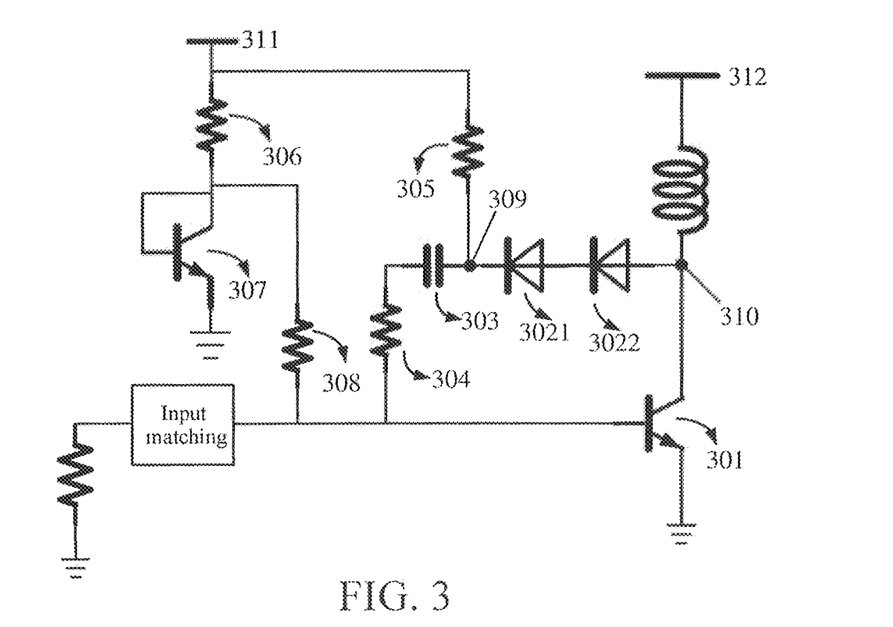
FIG. 3 is a principle diagram of a first-stage amplifier circuit according to a second embodiment of the present invention.

As shown in FIG. 3, a first-stage amplifier circuit provided in the second embodiment includes a first bias circuit, a second feedback circuit, a transistor 301, and an input matching network. The first bias circuit includes a transistor 307, a resistor 306, and a resistor 307. The structure of the first bias circuit is the same as the structure of the first bias circuit shown in FIG. 2. The second feedback circuit includes a diode 3022, a diode 3021, a capacitor 303, and a resistor 304 sequentially connected in series. A resistor 305 is disposed between a node 309 and a first bias voltage 311. The diode 3022 is connected to a collector of the transistor 301 by using a node 310. A connection relationship between each part of the first-stage amplifier circuit is the same as that in the first embodiment, and details are not described herein again. Likewise, turning-on and turning-off of the second feedback circuit is controlled by adjusting a voltage value of the first bias voltage 311, so that the multi-gain mode power amplifier works in a high-gain mode or a low-gain mode, and a working current of the multi-gain mode power amplifier in the low-gain mode is reduced.

Because the diode 3021 and the diode 3022 are connected in series, an equivalent turn-on voltage of the diode changes to 2Vth. A relationship between a working state of the first-stage amplifier circuit and the first bias voltage 311 of the first bias circuit is summarized in Table 2, and a supply voltage VCC switching point used to distinguish between the two modes is 3Vth. A working principle of the multi-gain mode power amplifier is the same as that in the first embodiment, and details are not described herein again.

TABLE 2

Table of a relationship between a working state of the first-stage amplifier circuit and the first bias voltage

| Mode 1: VCC > 3Vth | |
|---|---|
| Vreg_max ≥ Vreg ≥ VCC-2Vth | The transistor is turned on, and the diode is not conducted |
| VCC-2Vth > Vreg ≥ Vth | The transistor is turned on, and the diode is conducted |
| Vth > Vreg ≥ 0 | The transistor is not turned on, and the diode is conducted |
| Mode 2: VCC ≤ 3Vth | |
| Vreg_max ≥ Vreg ≥ Vth | The transistor is turned on, and the diode is not conducted |
| Vth > Vreg ≥ VCC-2Vth | The transistor is not turned on, and the diode is not conducted |
| VCC-2Vth > Vreg ≥ 0 | The transistor is not turned on, and the diode is conducted |

Third Embodiment

Figure 4:
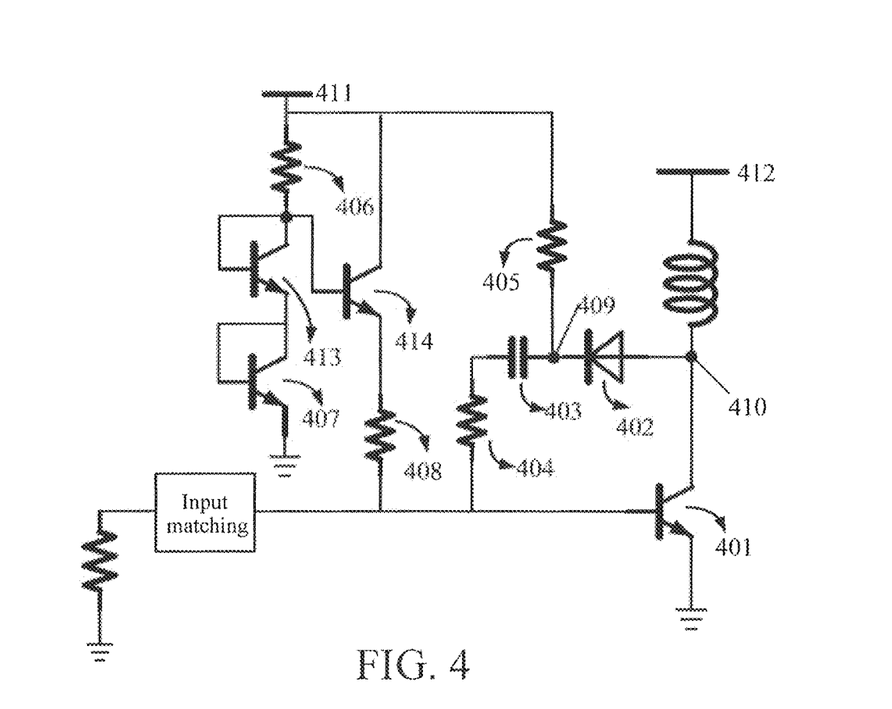
FIG. 4 is a principle diagram of a first-stage amplifier circuit according to a third embodiment of the present invention.

As shown in FIG. 4, a first-stage amplifier circuit provided in the third embodiment includes a second bias circuit, a first feedback circuit, a transistor 401, and an input matching network. The second bias circuit includes a transistor 407, a transistor 413, a transistor 414, a resistor 406, and a resistor 408. The structure of the second bias circuit is the same as the structure of the second bias circuit of the second-stage amplifier circuit shown in FIG. 1, and details are not described herein again. The first feedback circuit includes a diode 402, a capacitor 403, and a resistor 404 sequentially connected in series. A second bias voltage 411 provides a bias voltage to the second bias circuit by using the resistor 406. Likewise, a resistor 405 is disposed between the second bias voltage 411 and a node 409. A supply voltage 412 supplies power to the first-stage amplifier circuit by using an inductor. A connection relationship between each part of the first-stage amplifier circuit is the same as that in the first embodiment. Likewise, turning-on and turning-off of the first feedback circuit is controlled by adjusting a voltage value of the second bias voltage 411, so that the multi-gain mode power amplifier works in a high-gain mode or a low-gain mode, and a working current of the multi-gain mode power amplifier in the low-gain mode is reduced.

As shown in Table 3, the transistor 401 can be turned on only when the second bias voltage 411 (Vreg) of the second bias circuit is greater than 2Vth. A relationship between a working state of the first-stage amplifier circuit and the second bias voltage of the second bias circuit is summarized in Table 3, and a supply voltage VCC switching point used to distinguish between the two modes is 3Vth. A working principle of the multi-gain mode power amplifier is also the same as that in the first embodiment, and details are not described herein again.

TABLE 3

Table of a relationship between a working state of the first-stage amplifier circuit and the second bias voltage

| Mode 1: NCC > 3Vth | |
|---|---|
| Vreg_max ≥ Vreg ≥ VCC-Vth | The transistor is turned on, and the diode is not conducted |
| VCC-Vth > Vreg ≥ 2Vth | The transistor is turned on, and the diode is conducted |
| 2Vth > Vreg ≥ 0 | The transistor is not turned on, and the diode is conducted |
| Mode 2: VCC ≤ 3Vth | |
| Vreg_max ≥ Vreg ≥ 2Vth | The transistor is turned on, and the diode is not conducted |
| 2Vth > Vreg ≥ VCC-Vth | The transistor is not turned on, and the diode is not conducted |
| VCC-Vth > Vreg ≥ 0 | The transistor is not turned on, and the diode is conducted |

Fourth Embodiment

Figure 5:
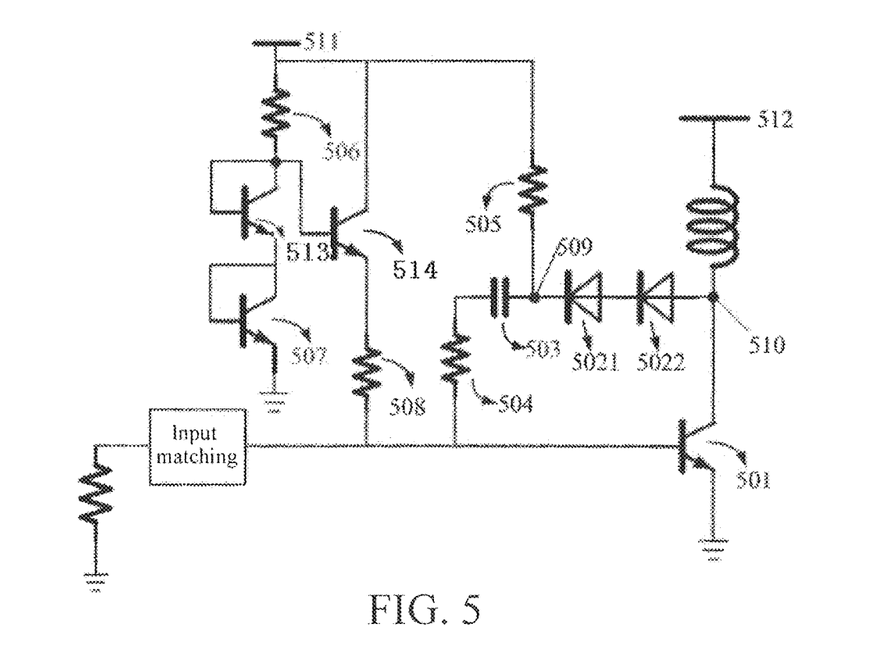
FIG. 5 is a principle diagram of a first-stage amplifier circuit according to a fourth embodiment of the present invention.

As shown in FIG. 5, a first-stage amplifier circuit provided in the fourth embodiment includes a second bias circuit, a second feedback circuit, a transistor 501, and an input matching network. The second bias circuit includes a transistor 507, a transistor 513, a transistor 514, a resistor 506, and a resistor 508. The structure of the second bias circuit is the same as the structure of the second bias circuit of the second-stage amplifier circuit shown in FIG. 1, and details are not described herein again. The second feedback circuit includes a diode 5022, a diode 5021, a capacitor 503, and a resistor 504. The structure of the second feedback circuit is the same as the structure of the second feedback circuit shown in FIG. 3, and details are not described herein again. A second bias voltage 511 provides a bias voltage to the second bias circuit by using the resistor 506. Likewise, a resistor 505 is disposed between the second bias voltage 511 and a node 509. A supply voltage 512 supplies power to the first-stage amplifier circuit by using an inductor. A connection relationship between each part of the first-stage amplifier circuit is the same as that in the first embodiment. Likewise, turning-on and turning-off of the second feedback circuit is controlled by adjusting the voltage value of the second bias voltage 511, so that the multi-gain mode power amplifier works in a high-gain mode or a low-gain mode, and a working current of the multi-gain mode power amplifier in the low-gain mode is reduced.

The diode 5021 and the diode 5022 are connected in series, and an equivalent turn-on voltage of the diode is 2Vth. A relationship between a working state of the first-stage amplifier circuit and the second bias voltage of the second bias circuit is summarized in Table 4, and a supply voltage VCC switching point used to distinguish between the two modes is 4Vth. A working principle of the multi-gain mode power amplifier is also the same as that in the first embodiment, and details are not described herein again.

Figure 8:
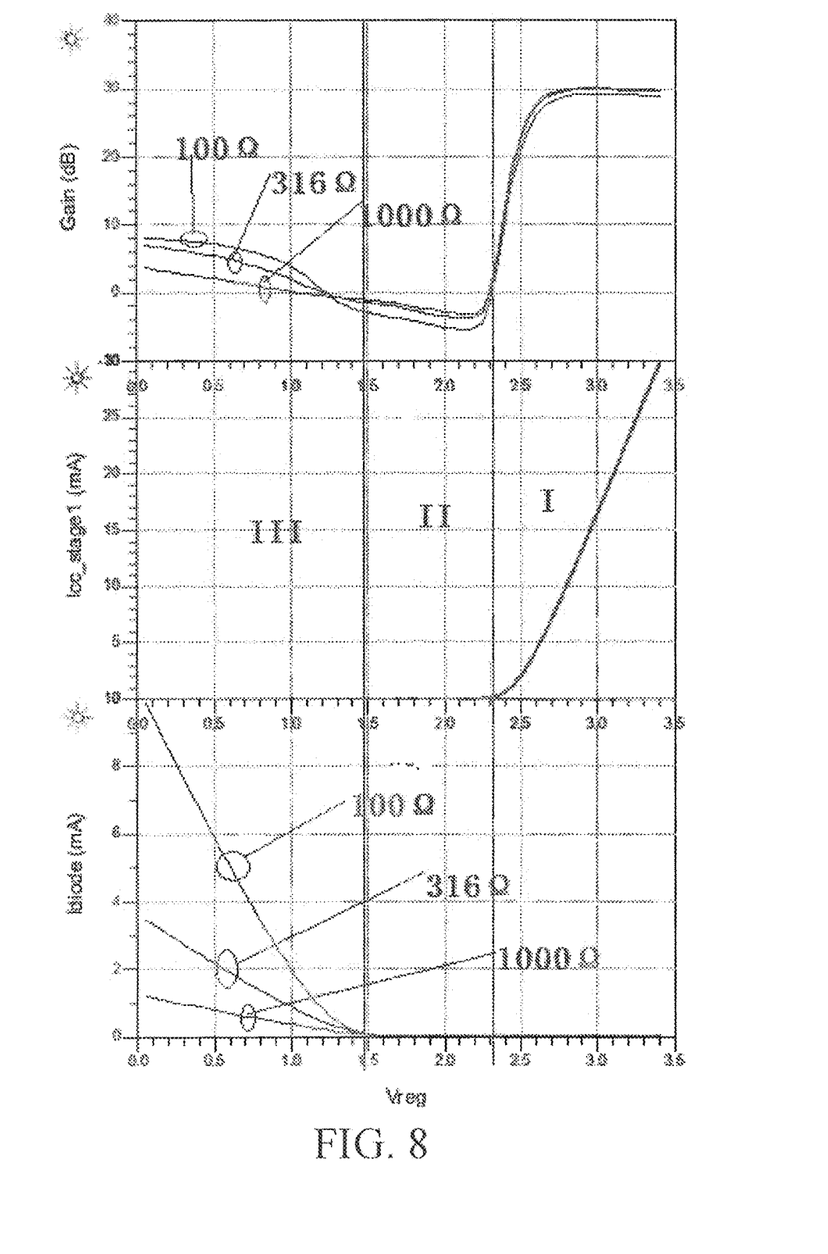
FIG. 8 is a schematic diagram showing impact of variations of a resistor 505 on a conduction current of a diode and on a gain when the diode is conducted according to the fourth embodiment of the present invention.

FIG. 8 shows impact of variations of the resistor 505 on a conduction current of the diode in the second feedback circuit and impact on the gain mode when the diode is conducted. The supply voltage 512 (VCC) of the first-stage amplifier circuit is set to 4 V, the turn-on voltage of the diode in the second feedback circuit is 1.2 V, and such a voltage setting corresponds to a case in Table 4 in the mode 2. An area I corresponds to a case in which the second bias voltage 511 (Vreg) is not less than a voltage difference between the supply voltage 512 (VCC) and a breakover voltage (2Vth) of the diode 5021 and the diode 5022 and is not greater than a maximum value (Vreg_max) of the second bias voltage 511. In this case, the transistor 501 is turned on, the diode 5021 and the diode 5022 are not conducted, and the gain mode of the first-stage amplifier circuit is implemented by the using transistor 501. As the second bias voltage 511 (Vreg) decreases, a current of the transistor 501 decreases, and a gain of the first-stage amplifier circuit decreases. An area II corresponds to a case in which the second bias voltage 511 (Vreg) is not less than the voltage difference between the supply voltage (VCC) and the breakover voltage (2Vth) of the diode 5021 and the diode 5022 and is less than the breakover voltage (2Vth) of the diode 5021 and the diode 5022. In this case, the transistor 501 is not turned on, the diode 5021 and the diode 5022 are not conducted, and the first-stage amplifier circuit is in a turned-off state. An area III corresponds to a case in which the second bias voltage 511 (Vreg) is not less than 0 and is less than the voltage difference between the supply voltage and the breakover voltage (2Vth) of the diode 5021 and the diode 5022. In this case, the transistor 501 is not turned on, the diode 5021 and the diode 5022 are conducted, and an input signal is transmitted to the second-stage amplifier circuit by using the second feedback circuit to implement the low-gain mode. In the area III, different currents of the diode and different gains in the low-gain mode can be obtained by using different values of the resistor 505. When the resistor 505 provides 100Ω, a maximum conduction current of the diode can reach 9.9 mA, and the gain in this case is 8.1 dB. When the resistor 505 provides 1000Ω, a conduction current of the diode is 1.2 mA, and the gain in this case is 3.6 dB.

TABLE 4

Table of a relationship between a working state of the first-stage amplifier circuit and the second bias voltage

| Mode 1: VCC > 4Vth | |
|---|---|
| Vreg_max ≥ Vreg ≥ VCC_2Vth | The transistor is turned on, and the diode is not conducted |
| VCC-2Vth > Vreg ≥ 2Vth | The transistor is turned on, and the diode is conducted |
| 2Vth > Vreg ≥ 0 | The transistor is not turned on, and the diode is conducted |
| Mode 2: VCC ≤ 4Vth | |
| Vreg_max ≥ Vreg ≥ 2Vth | The transistor is turned on, and the diode is not conducted |
| 2Vth > Vreg ≥ VCC-2Vth | The transistor is not turned on, and the diode is not conducted |
| VCC-2Vth > Vreg ≥ 0 | The transistor is not turned on, and the diode is conducted |

It should be noted that, in the multi-gain mode power amplifier provided in the first embodiment, the resistor 205 is connected between the first bias voltage 211 (Vreg) of the first bias circuit and the node 209 in the first feedback circuit. A forward conduction current during the conduction of the diode 202 can be adjusted by using the resistor 205, to adjust the gain mode of the multi-gain mode power amplifier in the low-gain mode. The resistor in the structure of the multi-gain mode power amplifier provided in the second embodiment is the resistor 305, the resistor in the structure of the multi-gain mode power amplifier provided in the third embodiment is the resistor 405, and the resistor in the structure of the multi-gain mode power amplifier provided in the fourth embodiment is the resistor 505.

In addition, the multi-gain mode power amplifier provided in the present invention is not limited to being applied to the two-stage amplifier circuit shown in the foregoing embodiments, but may further be applied to a three-stage amplifier circuit or a multi-stage amplifier circuit. For example, the three-stage amplifier circuit may be implemented by adding a stage of fixed gain structure to an existing second-stage amplifier circuit. The fixed gain structure is the second-stage amplifier circuit in an existing two-stage amplifier circuit. Alternatively, based on the three-stage amplifier circuit, the first two stages may be changed into variable gain structures, and the variable gain structures are the first-stage amplifier circuits in the existing two-stage amplifier circuit. The multi-stage amplifier circuit may include several variable gain structures and several fixed gain structures connected in cascade.

The multi-gain mode power amplifier shown in the foregoing embodiments may further be used in a communication terminal, to serve as an important part of a radio frequency circuit. The communication terminal refers to a computer device including but not limited to a mobile phone, a notebook computer, a tablet computer, an in-vehicle computer, and the like that can be used in a mobile environment and that supports various communication standards such as GSM, EDGE, TD_SCDMA, TDD_LTE, and FDD_LTE. In addition, the multi-gain mode power amplifier is also applicable to another scenario in which a multimode technology is used, for example, a communications base station compatible with various communication standards. This is not described in detail herein.

The foregoing describes in detail the multi-gain mode power amplifier, the chip, and the communication terminal provided in the present invention. For a person of ordinary skill in the art, any obvious changes made without departing from the essential spirit of the present invention shall fall within the protection scope of the present invention.

What is claimed is:

1. A multi-gain mode power amplifier, comprising a plurality of stages of amplifier circuits, and the plurality of stages comprises several variable gain structures and several fixed gain structures connected in cascade, wherein
    a amplifier circuit comprises a bias circuit, a feedback circuit, a transistor, and an input matching network/output matching network, wherein the bias circuit, the feedback circuit, the transistor, and the input matching network are connected to each other;
    the input matching network/the output matching network is configured to receive/send a radio frequency signal; a bias voltage end is connected to the bias circuit and the feedback circuit, a control voltage end is connected to the feedback circuit, and a power supply supplies power to the amplifier circuit by using an inductor; and
    a bias voltage or a control voltage is adjusted to enable the feedback circuit to be in a turned-on or turned-off state, so that the amplifier circuit works in a high-gain mode or a low-gain mode;
    when the multi-gain mode power amplifier is in the high-gain mode, a first bias voltage of a first-stage amplifier circuit is greater than a breakover voltage of a transistor of the first-stage amplifier circuit, and a second bias voltage of a second-stage amplifier circuit is greater than a breakover voltage of a transistor of the second-stage amplifier circuit.

2. The multi-gain mode power amplifier according to claim 1, wherein there are two stages of amplifier circuits, the first-stage amplifier circuit is a variable gain structure, the second-stage amplifier circuit is a fixed gain structure, and the first-stage amplifier circuit and the second-stage amplifier circuit are connected in series.

3. The multi-gain mode power amplifier according to claim 1, wherein
    the output matching network is configured to implement impedance translation of the radio frequency signal, to output a power to an outside based on the radio frequency signal transmitted by the first-stage amplifier circuit.

4. The multi-gain mode power amplifier according to claim 1, wherein
    when the multi-gain mode power amplifier is in the high-gain mode, the control voltage of the feedback circuit of the first-stage amplifier circuit is less than a supply voltage of the first-stage amplifier circuit, and a voltage difference between the control voltage and the supply voltage is less than the breakover voltage of the transistor, so that the feedback circuit is in a turned-off state, and the first-stage amplifier circuit implements the high-gain mode by using the transistor.

5. The multi-gain mode power amplifier according to claim 1, wherein
    when the multi-gain mode power amplifier is in the low-gain mode, the control voltage of the feedback circuit is less than a supply voltage of the first-stage amplifier circuit, and a voltage difference between the control voltage and the supply voltage is greater than the breakover voltage of the transistor of the first-stage amplifier circuit, so that the feedback circuit is in a turned-on state, and the first-stage amplifier circuit implements the low-gain mode.

6. The multi-gain mode power amplifier according to claim 1, wherein
    when the multi-gain mode power amplifier is in the high-gain mode, a supply voltage (VCC) of the first-stage amplifier circuit is greater than a sum of a turn-on voltage (Vth_main) of a transistor of the first-stage amplifier circuit and a breakover voltage (Vth_diode) of a diode.

7. The multi-gain mode power amplifier according to claim 6, wherein
    when a bias voltage (Vreg) of a first bias circuit is not less than a voltage difference between the supply voltage (VCC) and the breakover voltage (Vth_diode) of the diode and is not greater than a maximum value (Vreg_max) of the bias voltage, the transistor in the first-stage amplifier circuit is turned on, and the diode is not conducted, to enable the first-stage amplifier circuit to implement the high-gain mode.

8. The multi-gain mode power amplifier according to claim 7, wherein
    a current of the transistor decreases as the bias voltage (Vreg) of the bias circuit decreases.

9. The multi-gain mode power amplifier according to claim 6, wherein
    when the bias voltage (Vreg) of the bias circuit is not less than the turn-on voltage (Vth_main) of the transistor and is less than the voltage difference between the supply voltage (VCC) and the breakover voltage (Vth_diode) of the diode, the transistor is turned on, and the diode is also conducted, so that a gain of the first-stage amplifier circuit decreases.

10. The multi-gain mode power amplifier according to claim 6, wherein
when the bias voltage (Vreg) of the bias circuit is not less than 0 and is less than the turn-on voltage (Vth_main) of the transistor, the transistor is not turned on, the diode is conducted, an input signal is transmitted to the second-stage amplifier circuit by using the feedback circuit, and a gain of the first-stage amplifier circuit is the lowest.

11. The multi-gain mode power amplifier according to claim 1, wherein
when the multi-gain mode power amplifier is in the low-gain mode, a supply voltage (VCC) of the first-stage amplifier circuit is not greater than a sum of a turn-on voltage (Vth_main) of a transistor of the first-stage amplifier circuit and a breakover voltage (Vth_diode) of a diode.

12. The multi-gain mode power amplifier according to claim 11, wherein
when the bias voltage (Vreg) of the bias circuit is not less than the turn-on voltage (Vth_main) of the transistor and is not greater than a maximum value (Vreg_max) of the bias voltage, the transistor is turned on, the diode is not conducted, and the gain mode of the first-stage amplifier circuit is implemented by using the transistor.

13. The multi-gain mode power amplifier according to claim 11, wherein
when the bias voltage (Vreg) of the bias circuit is not less than a voltage difference between the supply voltage (VCC) and the breakover voltage (Vth_diode) of the diode and is less than the turn-on voltage (Vth_main) of the transistor, the transistor is not turned on, the diode is also not conducted, and the first-stage amplifier circuit is in a turned-off state.

14. The multi-gain mode power amplifier according to claim 11, wherein
when the bias voltage (Vreg) of the bias circuit is not less than 0 and is less than a voltage difference between the supply voltage (VCC) and the breakover voltage (Vth_diode) of the diode, the transistor is not turned on, the diode is conducted, and an input signal is transmitted to the second-stage amplifier circuit by using the feedback circuit.

15. A chip having a multi-gain mode power amplifier, wherein the chip comprises the multi-gain mode power amplifier according to claim 1.

16. A communication terminal having a multi-gain mode power amplifier, wherein the communication terminal comprises the multi-gain mode power amplifier according to claim 1.

\* \* \* \* \*